(12) United States Patent
Kim et al.

(10) Patent No.: US 8,289,787 B2
(45) Date of Patent: Oct. 16, 2012

(54) SEMICONDUCTOR MEMORY DEVICE AND METHOD FOR OPERATING THE SAME

(75) Inventors: Ji-Hwan Kim, Gyeonggi-do (KR); Seong-Je Park, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 113 days.

(21) Appl. No.: 12/974,419

(22) Filed: Dec. 21, 2010

(65) Prior Publication Data
US 2011/0267905 A1    Nov. 3, 2011

(30) Foreign Application Priority Data

Apr. 30, 2010    (KR) .................. 10-2010-0040714

(51) Int. Cl.
*G11C 7/00*    (2006.01)
(52) U.S. Cl. .............. 365/189.16; 365/189.09; 365/211
(58) Field of Classification Search .............. 365/189.16, 365/189.09, 211
See application file for complete search history.

(56) References Cited

U.S. PATENT DOCUMENTS

| 2009/0296465 | A1* | 12/2009 | Wang et al. | 365/185.2 |
| 2010/0110793 | A1* | 5/2010 | Kim et al. | 365/185.18 |
| 2010/0110815 | A1* | 5/2010 | Lee et al. | 365/211 |
| 2012/0106242 | A1* | 5/2012 | Lee et al. | 365/163 |

FOREIGN PATENT DOCUMENTS

KR    1020090120683    11/2009

OTHER PUBLICATIONS

Notice of Preliminary Rejection issued from Korean Intellectual Property Office on Aug. 23, 2011.

* cited by examiner

*Primary Examiner* — Tuan T. Nguyen
(74) *Attorney, Agent, or Firm* — IP & T Group LLP

(57) ABSTRACT

A semiconductor memory device, including a temperature detector configured to output a temperature detection signal in response to a temperature detected in a core region which includes a plurality of memory cells, and a programming voltage generator configured to generate a programming voltage in response to the temperature detection signal and output a generated programming voltage to the core region.

13 Claims, 2 Drawing Sheets

SEMICONDUCTOR MEMORY DEVICE AND METHOD FOR OPERATING THE SAME

CROSS-REFERENCE TO RELATED APPLICATIONS

The present application claims priority of Korean Patent Application No. 10-2010-0040714, filed on Apr. 30, 2010, which is incorporated herein by reference in its entirety.

BACKGROUND OF THE INVENTION

Exemplary embodiments of the present invention relate to a semiconductor device design technology, and more particularly, to a semiconductor memory device which programs data by using a programming voltage.

In general, semiconductor memory devices are divided into volatile memory devices such as Dynamic Random Access Memory (DRAM) devices and Static Random Access Memory (SRAM) devices, and into non-volatile memory devices such as Programmable Read Only Memory (PROM), Erasable PROM (EPROM), Electrically EPROM (EEPROM), and flash memory devices.

The main difference between volatile memory devices and non-volatile memory devices is whether the memory device sustains a data after a predetermined time passes.

In other words, whereas the volatile memory device does not sustain data after a predetermined time passes, the non-volatile memory device does sustain data even after a predetermined time passes. Therefore, volatile memory devices perform a refresh operation to preserve data, while non-volatile memory devices do not perform the refresh operation. Since non-volatile memory devices are appropriate for low-voltage and high-integration purposes, they are widely used as a storage medium for storing data.

Meanwhile, flash memory device, which is a kind of non-volatile memory device, includes a plurality of memory cells for storing data. The plurality of memory cells are serially coupled with each other so as to form a string structure.

In a write operation, the flash memory device performs a program operation and an erase operation. The flash memory device stores data in the memory cells through the program operation and the erase operation. Herein, the program operation is an operation for accumulating electrons in a floating gate of a transistor that forms a memory cell.

The erase operation is an operation for discharging the electrons accumulated in the floating gate to a substrate. The flash memory device stores data of '0' or '1' in a memory cell through the aforementioned operations, detects the amount of electrons accumulated in the floating gate during a read operation, and outputs data of '0' or '1' based on the detection result.

Meanwhile, as described earlier, one memory cell stores data of '0' or '1'. In other words, one memory cell stores one bit of data, and the memory cell is referred to as a single-level cell (SLC).

Recently, a scheme of storing more than one bit of data in one memory cell has been adopted, and this kind of memory cell is referred to as a multi-level cell (MLC). The single-level cell requires a single threshold voltage to determine whether data of '0' or '1' is stored in the memory cell. On the other hand, the multi-level cell requires multiple threshold voltages to determine which data, for example, '00,' '01,' '10,' or '11,' is stored in the memory cell.

Accordingly, a semiconductor memory device uses an Incremental Step Pulse Program (ISPP) to give memory cells a predetermined distribution. Herein, the ISPP is a method of programming a memory cell by using a pulse having a voltage that is increased step by step from a predetermined starting voltage. The memory cell programs a desired data based on the programming voltage having the above-described pulse.

FIG. 1 illustrates a relationship between temperature and a threshold voltage distribution when a semiconductor memory device operates. For the sake of convenience in description, a threshold voltage set up in a hot temperature condition is referred to as a first deciding voltage V_VF1, and a threshold voltage set up in a cold temperature condition is referred to as a second deciding voltage V_VF2.

Referring to FIG. 1, a distribution of memory cells in a hot temperature condition and a distribution of memory cells in a cold temperature condition are shown for the same data. Generally, a semiconductor memory device has its operation characteristics varying according to temperature. As shown in FIG. 1, the memory cells are affected by temperature as well.

In other words, the threshold voltage value of a memory cell differs according to the temperature. To account for this trait, a method of setting up and controlling a deciding voltage according to the temperature may be used.

To be specific, since the threshold voltage of a memory cell is lowered in a hot temperature condition and increased in a cold temperature condition, the deciding voltage for determining the type of distribution, that is, the first deciding voltage V_VF1 and the second deciding voltage V_VF2, should be set to different values. For example, the second deciding voltage V_VF2 corresponding to the cold temperature condition is set to be higher than the first deciding voltage V_VF1 corresponding to the hot temperature condition.

When the memory cell described above uses the ISPP, it takes a predetermined time, which is a programming time, for the memory cell to have the distribution of FIG. 1 based on the ISPP. The programming time is different according to the distribution of the memory cells, which may be different according to whether the memory cell is in the hot temperature state or the cold temperature state. In other words, for the same data, the programming time in the cold temperature condition is longer than the programming time in the cold temperature condition.

SUMMARY OF THE INVENTION

Exemplary embodiments of the present invention are directed to a semiconductor memory device that may control a programming voltage according to temperature.

Exemplary embodiments of the present invention are also directed to a semiconductor memory device that may control a starting voltage of the programming voltage according to temperature.

In accordance with an exemplary embodiment of the present invention, an semiconductor memory device includes a temperature detector configured to output a temperature detection signal in response to a temperature detected in a core region which includes a plurality of memory cells, and a programming voltage generator configured to generate a programming voltage in response to the temperature detection signal and output the generated programming voltage to the core region.

The programming voltage may include a starting voltage set in response to the temperature detection signal.

The programming voltage may be increased step by step from the starting voltage by a predetermined voltage level.

In accordance with another exemplary embodiment of the present invention, a method for operating a semiconductor memory device includes determining a temperature in a core region which includes a plurality of memory cells, controlling and maintaining a starting voltage of a programming voltage based on the determined temperature, generating the programming voltage based on the starting voltage, and applying the generated programming voltage to the core region.

The method may further comprise setting up a deciding voltage corresponding to a memory cell based on the determined temperature.

In the controlling and maintaining of the starting voltage of the programming voltage, when the temperature is lower than a predetermined temperature, the starting voltage may be adjusted upwardly.

In accordance with another exemplary embodiment of the present invention, a method for operating a semiconductor memory device includes detecting a temperature of a core region, controlling a starting voltage of a programming voltage based on the detected temperature, generating the programming voltage based on the starting voltage, and applying the generated programming voltage to the core region.

The method may further comprise setting a deciding voltage corresponding to a memory cell based on the detected temperature.

During the controlling of the starting voltage, when the detected temperature is lower than a predetermined temperature, the starting voltage may be adjusted upwardly.

If the starting voltage is adjusted upwardly, the programming voltage may be increased step by step from the starting voltage by a predetermined voltage level.

During the controlling of the starting voltage, when the detected temperature is higher than a predetermined temperature, the programming voltage may be generated based on the starting voltage, which is lower than the starting voltage adjusted upwardly.

DESCRIPTION OF SPECIFIC EMBODIMENTS

Figure 1:
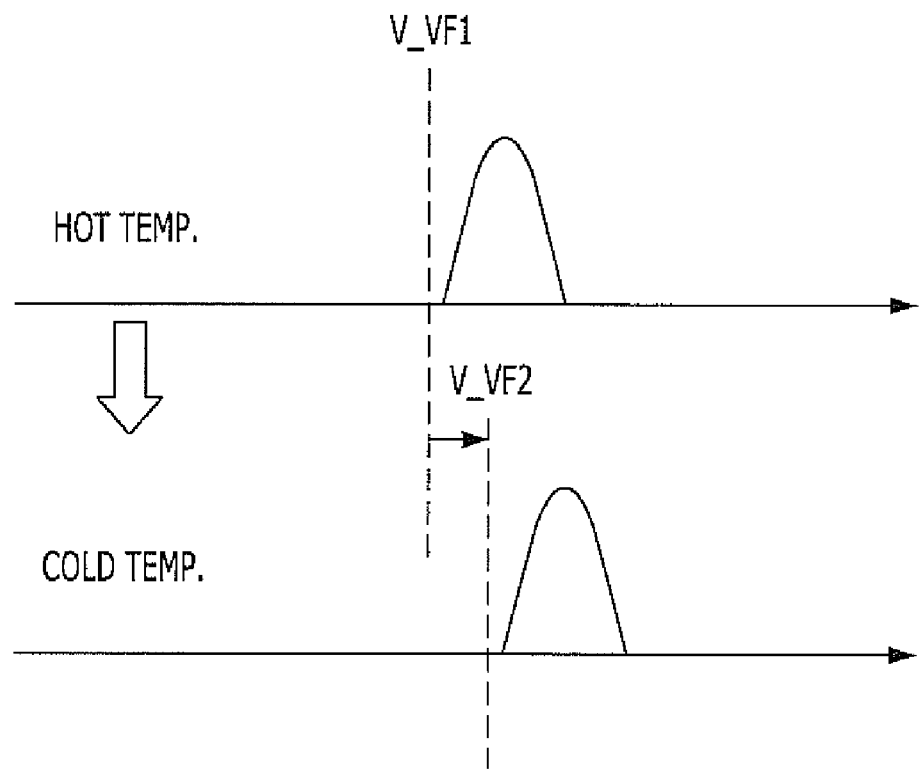
FIG. 1 illustrates a relationship between temperature and deciding voltage when a semiconductor memory device operates.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
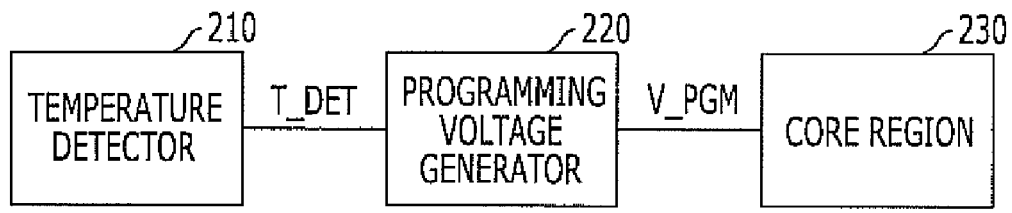
FIG. 2 is a block view illustrating a partial structure of the semiconductor memory device in accordance with an exemplary embodiment of the present invention.

FIG. 2 is a block view illustrating a partial structure of the semiconductor memory device in accordance with an exemplary embodiment of the present invention.

Referring to FIG. 2, the semiconductor memory device includes a temperature detector 210, a programming voltage generator 220, and a core region 230.

The temperature detector 210 generates a temperature detection signal T_DET in response to a temperature affecting the core region 230 which includes a plurality of memory cells.

The programming voltage generator 220 generates a programming voltage V_PGM corresponding to the temperature detection signal T_DET and outputs the generated programming voltage V_PGM to the core region 230. Herein, the programming voltage V_PGM is applied to the core region 230, and the plurality of the memory cells are distributed based on the programming voltage V_PGM.

The programming voltage V_PGM includes a starting voltage. The programming voltage V_PGM is a pulse signal that is increased step by step from the starting voltage by a predetermined voltage level according to the program operation.

Figure 3:
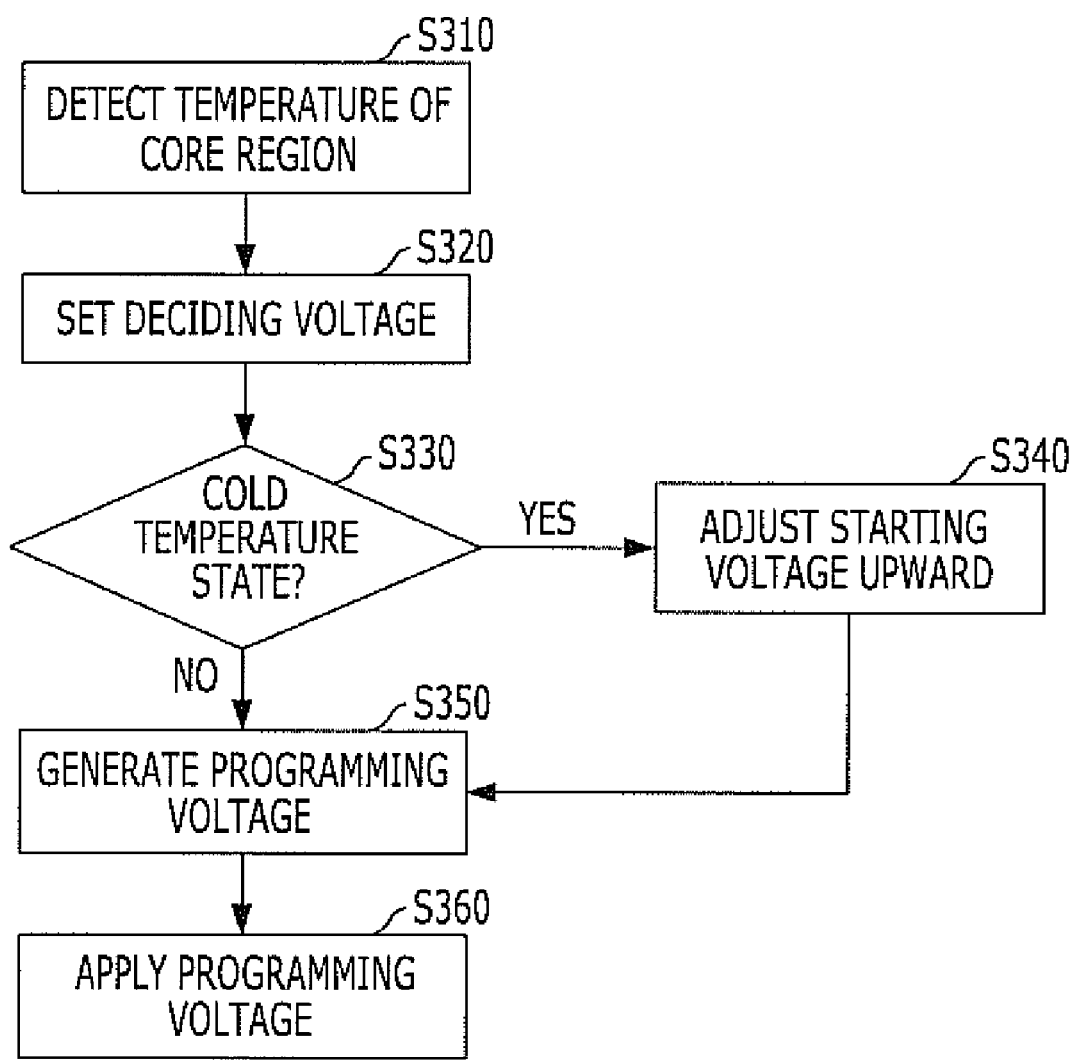
FIG. 3 is a flow chart showing an operation method of the semiconductor memory device shown in FIG. 2.

FIG. 3 is a flow chart showing an operation method of the semiconductor memory device shown in FIG. 2.

Referring to FIGS. 2 and 3, the operation method of the semiconductor memory device includes detecting a temperature of a core region at step S310, setting a deciding voltage at step S320, deciding whether the core region is in a cold temperature state at step S330, adjusting the starting voltage upward at step S340, generating a programming voltage at step S350, and applying the generated programming voltage at step S360.

At step S310, the temperature of the core region 230 is detected by the temperature detector 210 once a program operation begins.

At step S320, the deciding voltage is set through a mode register set (MRS) or is predetermined through a manufacturing process (e.g., cutting a fuse).

At step S330, it is determined whether the temperature detected in the core region 230 is in a cold temperature state.

When the temperature of the core region 230 is lower than a predetermined temperature at step S330, that is, when the semiconductor memory device is in a cold temperature state, the step S340 is performed, otherwise step S350 is performed.

At step S340, the starting voltage of the programming voltage V_PGM is adjusted upward.

Subsequently, at step S350, the programming voltage V_PGM for the ISPP is generated based on the starting voltage which is upwardly adjusted at step S340. At step S360, the generated programming voltage V_PGM is applied to the core region 230.

Alternatively, if it is determined that the core region of the semiconductor memory device is not in the cold temperature state at step S330, the programming voltage V_PGM generated at step S350 is generated based on the predetermined starting voltage, which is lower than the starting voltage set at step S340. At step S360, the generated programming voltage V_PGM is applied to the core region 230.

As described above, the semiconductor memory device fabricated in accordance with an exemplary embodiment of the present invention is capable of controlling the starting voltage of the programming voltage V_PGM for the ISPP based on the temperature.

In particular, the time taken for programming a cell through the ISPP may be reduced by upwardly adjusting the starting voltage of the programming voltage V_PGM when the core region is in the cold temperature state. This signifies that the general operation characteristics of the semiconductor memory device may be improved.

Accordingly, the present invention, which is described above, may increase the general operation characteristics of a semiconductor memory device by reducing the programming time of the semiconductor memory device.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a temperature detector configured to output a temperature detection signal in response to a temperature detected in a core region which includes a plurality of memory cells; and
   a programming voltage generator configured to generate a programming voltage in response to the temperature detection signal and output the generated programming voltage to the core region.

2. The semiconductor memory device of claim 1, wherein the programming voltage comprises a starting voltage set in response to the temperature detection signal.

3. The semiconductor memory device of claim 2, wherein the programming voltage is increased step by step from the starting voltage by a predetermined voltage level.

4. A method for operating a semiconductor memory device, comprising:
   determining a temperature in a core region which includes a plurality of memory cells;
   controlling and maintaining a starting voltage of a programming voltage based on a determined temperature;
   generating the programming voltage based on the starting voltage; and
   applying a generated programming voltage to the core region.

5. The method of claim 4, further comprising:
   setting a deciding voltage corresponding to a memory cell based on the determined temperature.

6. The method of claim 4, wherein in the controlling and maintaining of the starting voltage of the programming voltage, when the temperature is lower than a predetermined temperature, the starting voltage is adjusted upwardly.

7. The method of claim 6, wherein the programming voltage is increased step by step from the starting voltage by a predetermined voltage level.

8. The method of claim 4, wherein the starting voltage is higher than the predetermined starting voltage.

9. A method for operating a semiconductor memory device, comprising:
   detecting a temperature of a core region;
   controlling a starting voltage of a programming voltage based on the detected temperature;
   generating the programming voltage based on the starting voltage; and
   applying a generated programming voltage to the core region.

10. The method of claim 9, further comprising:
    setting a deciding voltage corresponding to a memory cell based on the detected temperature.

11. The method of claim 9, wherein during the controlling of the starting voltage, when the detected temperature is lower than a predetermined temperature, the starting voltage is adjusted upwardly.

12. The method of claim 11, wherein if the starting voltage is adjusted upwardly, the programming voltage is increased step by step from the starting voltage by a predetermined voltage level.

13. The method of claim 12, wherein during the controlling of the starting voltage, when the detected temperature is higher than a predetermined temperature, the programming voltage is generated based on the starting voltage, which is lower than the starting voltage adjusted upwardly.

* * * * *